(12) United States Patent
Malhan et al.

(10) Patent No.: US 8,432,189 B1
(45) Date of Patent: Apr. 30, 2013

(54) DIGITAL VOLTAGE LEVEL SHIFTER

(75) Inventors: Bipin B. Malhan, Great Noida (IN);
Gaurav Goyal, Dehradun (IN); Umesh Chandra Lohani, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/356,615

(22) Filed: Jan. 23, 2012

(51) Int. Cl.
*H03K 19/0175* (2006.01)

(52) U.S. Cl.
USPC .................... 326/81; 326/68; 326/80

(58) Field of Classification Search ............ 326/62, 326/68, 80–81; 327/333
See application file for complete search history.

(56) References Cited

U.S. PATENT DOCUMENTS

| | | | |
|---|---|---|---|
| 6,428,683 B1 | 8/2002 | Jaworowski | |
| 6,954,100 B2 | 10/2005 | Dharne | |
| 7,009,424 B2 | 3/2006 | Khan | |
| 7,061,299 B2 | 6/2006 | Khan | |
| 7,102,410 B2 | 9/2006 | Khan | |
| 7,187,205 B2 | 3/2007 | Ramaraju | |
| 7,315,183 B2 * | 1/2008 | Hinterscher | 326/81 |
| 7,443,223 B2 | 10/2008 | Bajkowski | |
| 7,446,566 B1 | 11/2008 | Chrudimsky | |
| 7,548,093 B1 | 6/2009 | Priel | |
| 7,560,970 B2 | 7/2009 | Cook | |
| 7,683,667 B2 * | 3/2010 | Kim | 326/63 |
| 7,683,668 B1 | 3/2010 | Thakur | |
| 7,777,522 B2 | 8/2010 | Yang | |
| 7,808,286 B1 | 10/2010 | Miller | |
| 7,816,948 B1 | 10/2010 | Sanchez | |
| 7,956,662 B2 | 6/2011 | Arora | |
| 2005/0258887 A1 * | 11/2005 | Ito et al. | 327/333 |

* cited by examiner

*Primary Examiner* — Anh Tran
(74) *Attorney, Agent, or Firm* — Charles Bergere

(57) ABSTRACT

A dual supply bidirectional level shifter performs voltage level shifting in two directions, low to high and high to low. A feedback control branch and a control stage inverter are provided that reduce leakage power and allow for low delay time while also allowing for a small circuit footprint.

8 Claims, 2 Drawing Sheets

… (US 8,432,189 B1)

DIGITAL VOLTAGE LEVEL SHIFTER

BACKGROUND OF THE INVENTION

The present invention relates to digital electronic circuits and, more particularly, to a voltage level shifter circuit that receives an input signal and generates an output signal that is a level-shifted version of the input signal.

Generally speaking, components and nodes in digital logic circuits transition from one logic level to another during the operation of the circuit. These transitions typically are between a logical high state at some voltage above ground level, and a logical low state at ground level. Occasionally, different circuits operating at different logical high voltage levels are required to interface with one another thereby requiring the voltage level of one circuit to be shifted with respect to the voltage level of the other circuit. For example, the voltage in one circuit may have a logic high voltage level of 0.75V and the voltage in the other circuit may have a logic high voltage level of 1.32V. The first circuit has a voltage swing of zero to 0.75V and the second circuit has a voltage swing of zero to 1.32V. Level shifters provide the connection between two such circuits, shifting the level of the signals from the first voltage swing to the second voltage swing.

One conventional voltage level shifter is illustrated in FIG. 1. This circuit attempts to eliminate static current, i.e. leakage current, consumption using a feedback circuit and a pull-device. The circuit comprises a first CMOS inverter 100 having complementary MOSFETs P1 and N1, a second CMOS inverter 110 having complementary MOSFETs P2 and N2, a third CMOS inverter 120 with complementary MOSFETs P3 and N3, and a feedback unit 130 comprising P-type MOSFET $P_{fb}$, N-type MOSFET $N_{fb}$ and pull up device $P_{pu}$ 140.

Each of the first and second inverters 100, 110 receives an input signal at a voltage $V_{in}$ at a first, lower voltage level $V_{DDL}$. The first inverter 100 outputs the inverse of the input signal at a node 150, which is input to the third inverter 120. The third inverter 120 inverts the signal at node 150 and provides an output signal $V_{out}$ at voltage level $V_{DDH}$, where the logical state of $V_{out}$ reflects that of $V_{in}$. Thus, $V_{out}$ is a level-shifted version of $V_{in}$.

The output of the second inverter 110 also is the inverse of the input voltage $V_{in}$, at the lower voltage level $V_{DDL}$. This is fed to the gate of device $N_{fb}$ of feedback unit 130. Similarly, the voltage at node 150 is fed to the gate of the device $P_{fb}$ of the feedback unit 130. The feedback unit 130 provides an output signal at node 170 that is used to drive the gate of pull-up device $P_{pu}$ 140.

Typically, the digital voltage level shifter of FIG. 1 operates as the input voltage at $V_{in}$ transitions between a logical high at the first voltage $V_{DDL}$ and a logical low at ground voltage where it is desired that the output voltage $V_{out}$ reflects the logical state of $V_{in}$, but at the level shifted voltage, $V_{DDH}$. In this circuit, the input voltage $V_{in}$ is at a first, lower voltage $V_{DDL}$ and the output voltage is at a second, higher voltage $V_{DDH}$. It is believed that improvements may be realized in reduction of leakage current when $V_{IN}$ rises to a logic high of $V_{DDL}$. For instance, and analyzing the case when $V_{IN}$ rises to a logic high of $V_{DRL}$, $N_1$ turns on, but $P_1$ initially does not completely turn off since the source of $P_1$ is at a voltage level of $V_{DDH}$. Thus, static current temporarily flows through $P_{PU}$, $P_1$, and $N_1$. Given the nature of normal CMOS processes, N-channel FETs have approximately twice the current sinking and sourcing capability of identically-sized P-channel FETs. Additionally, the circuit of FIG. 1 has two P-channel FETs, $P_1$ and $P_{PU}$, connected in series, thereby further reducing the strength of $P_1$ and $P_{PO}$ in comparison to $N_1$. Therefore, $N_1$ succeeds in pulling node 150 to ground. $V_{IN}$ also turns $N_2$ on and $P_2$ completely off (since the source of P2 is attached to $V_{DDL}$), thus pulling node 160 to ground. With the gates of both $P_{FB}$ and $N_{FB}$ pulled low, node 170 is pulled up to $V_{DDH}$ volts, thereby shutting off $P_{PU}$ and eliminating the static current that previously flowed through $P_{PU}$, $P_1$, and $N_1$, and terminating the drive fight between $P_1$ and $N_1$. Also, with node 150 being at ground, $P_3$ is on, $N_3$ is off, and $V_{OUT}$ is pulled up to $V_{DDH}$, all in response to $V_{IN}$ rising to $V_{DDL}$.

As $V_{IN}$ transitions to logical low, $P_1$ goes on and $N_1$ goes off, however, node 150 remains at logical low (ground) because in the previous cycle of operation (as described above), $P_{pu}$ was switched off, thereby isolating node 150 from $V_{DDH}$, at least temporarily.

Additionally, $P_2$ goes on and $N_2$ goes off, thereby pulling node 160 to logical high at $V_{DDL}$. In turn, $N_{fb}$ goes on and since node 150 is currently at ground, $P_{fb}$ is on, which means a leakage path exists from $V_{DDH}$ to ground through $P_{fb}$ and $N_{fb}$. Node 170 is being driven by $P_{fb}$ to be pulled up to $V_{DDH}$ and by $N_{fb}$ to be pulled to ground. Because $N_{fb}$ is of a physically larger size in order to influence the voltage at node 170 as described above, the larger-sized device $N_{fb}$ wins the drive fight eventually pulling node 170 to ground. Only then is node 150 pulled up to $V_{DDH}$ through $P_{pu}$ and $P_1$, thereby switching $P_{fb}$ off and cutting off the leakage from $V_{DDH}$ through $P_{fb}$ and $N_{fb}$ to ground.

The above-described circuit operation is less than optimal because of the leakage current from $V_{DDH}$ to ground through $P_{fb}$ and $N_{fb}$, which flows for a relatively long time which, in turn, requires the physical size of device $N_{fb}$ to be relatively large. Additionally, the circuit of FIG. 1 takes a relatively long time for the output voltage to transition to ground in response to a corresponding transition on the input voltage. Accordingly, it would be advantageous to have a digital voltage level shifter that provides some improvement on the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

Figure 1:
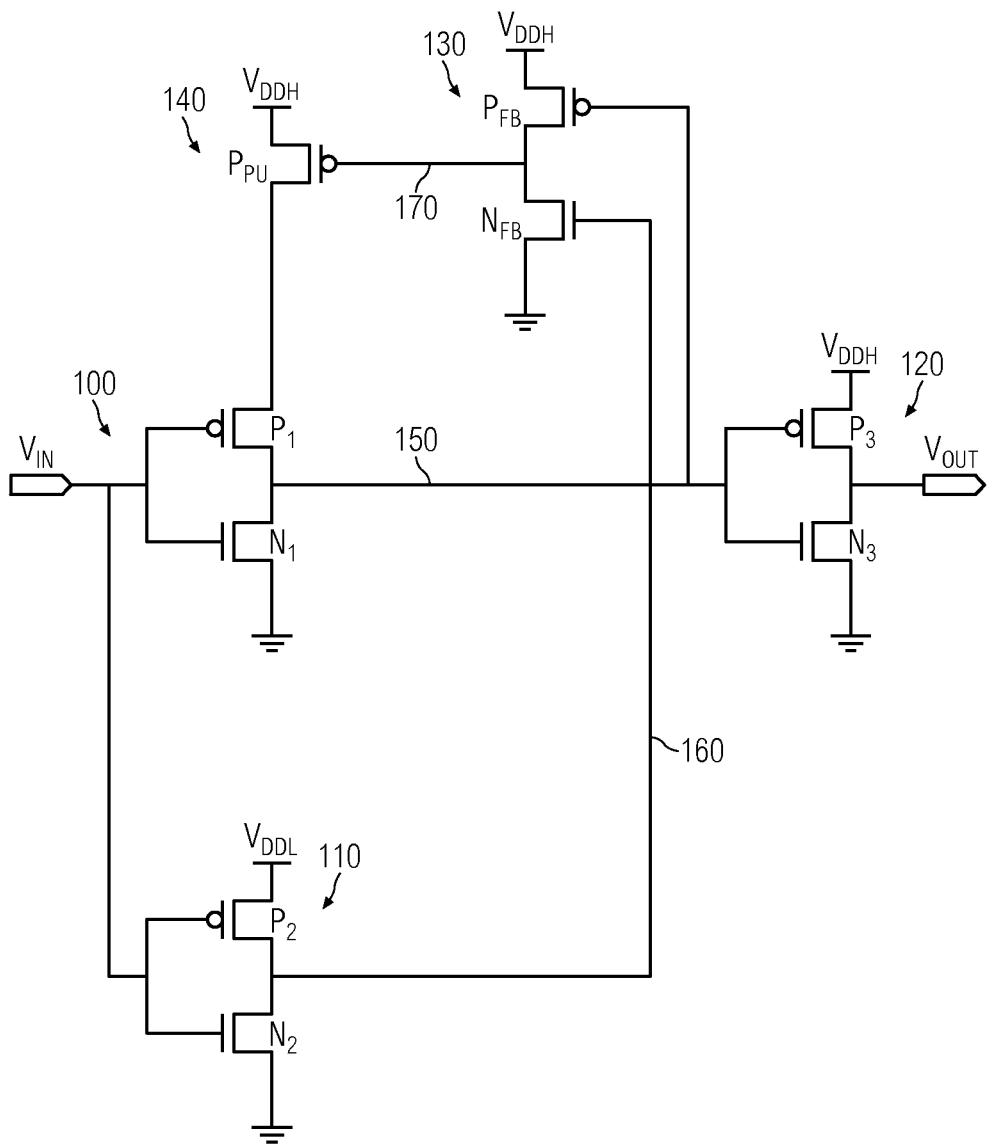
FIG. 1 illustrates a conventional digital voltage level shifter.

In an embodiment of the invention there is provided a digital voltage level shifter for receiving an input signal of a first voltage swing and outputting an output signal of a second voltage swing, the output signal being a level-shifted version of the input signal, the digital voltage level shifter comprising: a first inverter comprising: a first input for receiving the input signal; and a first output; a second inverter comprising: a second input connected to the first output; and a second output for outputting the output signal; and a control stage for controlling switching of the digital voltage level shifter, the control stage comprising a feedback circuit branch having a control stage switch configured to assume a non-conducting state dependent on a logical state of the output signal.

In another embodiment of the invention there is provided a digital voltage level shifter for receiving an input signal of a first voltage swing and outputting an output signal of a second voltage swing, the output signal being a level-shifted version of the input signal, the digital voltage level shifter comprising: a first inverter comprising: a first input for receiving the input signal; and a first output; a second inverter comprising: a second input connected to the first output; and a second output for outputting the output signal; and a control stage for controlling switching of the digital voltage level shifter, the control stage comprising: a control stage inverter having a control stage inverter input for receiving the input signal; and a control stage inverter output; and wherein the second inverter comprises a second inverter switch having a switch control input controlled by the control stage inverter output.

In a further embodiment of the invention there is provided a method of operating a digital voltage level shifter configured to receive an input signal of a first voltage swing and output an output signal of a second voltage swing, the output signal being a level-shifted version of the input signal, the method comprising: providing a first inverter comprising: a first input for receiving the input signal; and a first output; providing a second inverter comprising: a second input connected to the first output; and a second output for outputting the output signal; providing a control stage for controlling switching off the digital voltage level shifter, the control stage comprising a feedback circuit branch having a control stage switch; applying an input signal to the first input; and controlling the control stage switch to assume a non-conducting state dependent on a logical state of the output signal.

Embodiments of the invention may provide significant technical benefits in comparison with conventional techniques. In the first place, the leakage current that flows for a relatively long time in the conventional circuit of FIG. 1 from $V_{DDH}$ to ground through $P_{fb}$ and $N_{fb}$, is substantially reduced, as the digital voltage level shifter may be configured for the control stage switch to assume a non-conducting state dependent on a logical state of the output signal. Secondly, the physical size of the switching device that corresponds to device $N_{fb}$ in the conventional circuit of FIG. 1 may be of a significantly reduced size, thereby leading to a reduced footprint for the circuit. Thirdly, significant improvements may be realized in the time taken for the output voltage to fall to logical low/ground in response to the input voltage going to logical low.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to distinguish between the elements such terms describe. Thus, these terms are not necessarily intended to indicate temporal or other prioritization of such elements.

Because the apparatus implementing the present invention is, for the most part, composed of electronic components known to those skilled in the art, full details will not be explained in any greater extent than that considered necessary for the understanding and appreciation of the underlying concepts of the present invention and in order not to obfuscate or distract from the teachings of the present invention.

Figure 2:
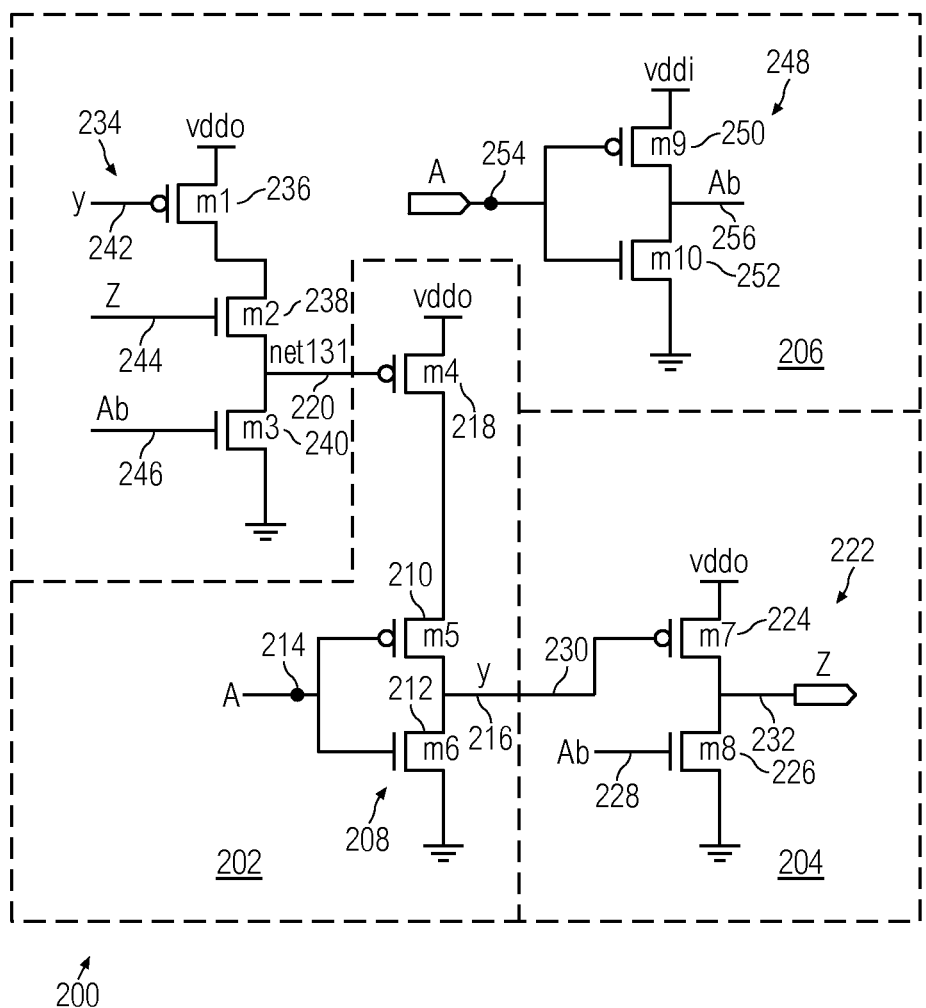
FIG. 2 illustrates a digital voltage level shifter in accordance with an embodiment of the present invention.

Referring now to FIG. 2, a digital voltage level shifter 200 in accordance with an embodiment of the invention is illustrated. The digital voltage level shifter 200 includes a voltage translation stage 202, a driver stage 204 and a control stage 206. The voltage translation stage 202 receives an input voltage and translates the input voltage to the voltage to which it is to be level shifted. The driver stage 204 drives the level-shifted output voltage. The control stage 206 controls switching of the digital voltage level shifter 200.

The voltage translation stage 202 comprises a first inverter 208 comprising a complementary CMOS pair of P-type MOSFET M5 210 and N-type MOSFET M6 212. The first inverter 208 has a first input 214 for receiving the input signal which is at a first or lower voltage level $V_{ddi}$. The first inverter 208 has a first output 216 that outputs a first output signal at node y, which is the logical inverse of the first input 214, but translated to the second, higher voltage level $V_{ddo}$. The drain terminals of M5 210 and M6 212 are tied together to provide the first output 216 of first inverter 208.

The voltage translation stage 202 further comprises another switching device M4 218 which, in the embodiment of FIG. 2, is a P-type MOSFET having a drive input 220 at its gate. The source of M4 218 is driven by the second, higher-voltage supply $V_{ddo}$, while the drain of M4 218 is connected in series to the source of M5 210.

The driver stage 204 comprises a second inverter 222 comprising a P-type MOSFET M7 224 and N-type MOSFET M8 226. Note that in the embodiment of FIG. 2, the second inverter 222 is not a true complementary CMOS inverter since the gates of M7 224 and M8 226 are not tied together. Instead, the gate of M8 226 has a switch control input 228 driven by an output of the control stage 206, which will be described in further detail below. On the other hand, the gate 230 of M7 224 is driven by the output of the first inverter 208 on node y. The gate of M7 224 is the second input of the second inverter 222. The drains of M7 224 and M8 226 are tied together and provide the second output 232, which is the output of the digital voltage level shifter 200. Additionally, the source of M7 224 is tied to the higher-voltage supply $V_{ddo}$, and the source of M8 226 is tied to ground.

The control stage 206 comprises a feedback circuit branch 234 including three switches PMOSFET M1 236, NMOSFET M2 (control stage switch) 238, and NMOSFET M3 240. The first switch M1 236 has a source connected to the higher-voltage $V_{ddo}$ and a drain tied to a drain of the second switch M2 238. The second or control stage switch M2 238 has a source connected to a drain of the third switch M3 240, and a source of the third switch M3 240 is tied to ground. Thus, the control stage switch M2 238 is connected in series between PMOS and NMOS transistors 236, 240. In the embodiment of FIG. 2, the control stage switch M2 238 is a low-voltage threshold device.

The first switch M1 236 has a switch control input 242, in which a gate of the first switch M1 236 is connected to the output of the first inverter 208 at node y. The control stage switch M2 238 has a switch control input 244, in which a gate of the control stage switch M2 238 is connected to the output of the second inverter 222. The third switch M3 240 has a switch control input 246, in which a gate of the third switch M3 240 is connected to an output of a third inverter 248, as will be described below.

The control stage 206 further comprises a control stage inverter 248 comprising a complementary CMOS pair of PMOSFET M9 250 having a source connected to a lower-voltage supply $V_{ddi}$, and NMOSFET M10 252 having a source terminal tied to ground. The drains of M9 250 and M10 252 are connected together and provide the control stage inverter output 256 at node Ab, which drives device M3 240 at its gate 246, as noted above. Also the gates of M9 250 and M10 252 are tied together and form the control stage input 254 of the control stage inverter 248. For the avoidance of leakage between $V_{ddi}$ and ground through M9 250 and M10 252, the gates M9 250 and M10 252 are driven by a signal A which has a range from ground to $V_{ddi}$. Thus, the feedback circuit branch 234 has the third switch M3 240, which has its gate 246 controlled by the output 256 of the control stage inverter 248.

In operation, when input A goes to logical high/$V_{ddi}$, MOSFET device M5 210 of the first inverter 208 is switched partially on, and transitions to being switched fully off after node net131 is pulled up to logical high. This is driven by M1 236 and M2 238, the gates y 242 and Z 244 of which are, respectively, at logical low and logical high/$V_{ddo}$ and MOSFET device M6 212 being switched on. This pulls the first output 216 of the first inverter 208 at node y to logical low/ground. In turn, this switches M7 224 on and the second output 232 at node Z is pulled to high/$V_{ddo}$. So, the logical state of the second output at node Z reflects the logical state of input A, but at the higher voltage level, $V_{ddo}$.

Because the first input A on 214 is at logical high/$V_{ddi}$, and because the control stage inverter input A 254 is tied to the first input 214, PMOSFET M9 250 of the control stage inverter 248 is switched off, corresponding NMOSFET M10 252 is switched on and the control stage inverter output 256 at node Ab is pulled to logical low/ground. This drives second inverter switch M8 226 to off, as the switch control input 228 of M8 226 is tied to the control stage inverter output 256 at node Ab. This ensures that the second output 232 at node Z remains at logical high/$V_{ddo}$.

As node y is at logical low/ground, switch M1 236 is turned on because its gate is tied to node y 216. Additionally, and because the second output Z 232 is tied to the switch control input 244 of control stage switch M2 244, this device switches on. Further, the third switch NMOSFET M3 240 of the feedback circuit branch 234 is also switched off because it is driven by the control stage inverter 248 output Ab 256. As a consequence, the node net131 220 at the gate of M4 218 is pulled up approximately to logical high/$V_{ddo}$. Actually, the gate of M4 218 is at the level of $V_{ddo}$ less the threshold voltage $V_{t1}$ of the control stage switch M2 238 which is, in this embodiment, a low voltage threshold device. Therefore, this means that M4 218 is eventually switched off, as the difference between the gate voltage of M4 218 and the source voltage should be greater than the threshold voltage $V_t$ of M4 218, in this embodiment a standard threshold voltage device. That is, (Vddo−Vt1) gate voltage of m4−(Vdd0) source voltage of m4|=|Vt1|<|Vt| of M4 218 as the standard MOSFET threshold voltage is greater than the threshold voltage of a LVT MOSFET. As a consequence of M4 218 being switched off, there is no leakage current from $V_{ddo}$ to ground through M4 218, M5 210 and M6 212.

Now, considering the case where input A 214 goes to logical low/ground, M6 212 is switched off and M5 210 is switched on. However, because M4 218 remains in the off state from the previous cycle of operation when the input voltage switched to a logical level high, as noted above, the first output 216 of the first inverter 208 at node y is floating.

Additionally, M9 250 is switched on and M10 252 is switched off, thereby pulling up the control stage inverter output 256 at node Ab to logical high/$V_{ddi}$. In turn, this switches on M8 226, pulling the second output 232 at node Z to ground. (M7 224 is in the conducting state at this time, but only for a very short period. M3 240 and M8 226 are switched on simultaneously, so net131 220 is pulled to ground, in turn switching on M4 218 and pulling node y 216 to logical high/$V_{ddo}$ very quickly through M4 218 and M5 210 and, therefore, M7 224 is switched off.) Therefore, the logical state of the second output 232 at node Z reflects the logical state of the signal on input 214, on node A. The control stage inverter 248 has a control stage inverter input 254 for receiving the input signal A and a control stage inverter output 256. The second inverter switch 226 of the second inverter 222 has a switch control input 228 controlled by the output Ab 256 of the control stage inverter 248.

It will also be appreciated that FIG. 2 illustrates a digital voltage level shifter 200 for receiving an input signal of a first voltage swing and outputting an output signal of a second voltage swing, the output signal being a level-shifted version of the input signal. In the embodiment of FIG. 2, the switch control input 228 of the second inverter 222 is connected to the control stage inverter output 256 on node Ab.

Immediately following the switching on of M8 226, which pulls the second output 232 at node Z to ground, the control stage switch M2 238 assumes a non-conducting state because its gate 244 is tied to and driven by output 232 at node Z, and the feedback circuit branch 234 is put into an open-circuit condition, regardless of the state of the first switch M1 236 (still on at this point from the previous cycle of operation when the input on 214 went to logical high) and the third switch M3 240.

Further, because the control stage inverter output 256 has been pulled to logical high/$V_{ddi}$, then M3 240 is also switched on, thereby pulling the voltage at node net131 220 to ground, switching on M4 218 and driving the voltage of the first output 216 of the first inverter 208 at node y to logical high/$V_{ddo}$, thereby switching off M7 224. Switching on of M8 226 as mentioned above pulls the second output 232 at node Z to ground. So, the second inverter switch M8 226 (an NMOSFET) is configured to assume a conducting state when the input signal A is at a logical low state. The second inverter 222 further comprises a PMOSFET M7 224, which has a gate terminal that receives the second input 230 of the second inverter 222 at node y.

After the first output 216 at node y has been pulled up to logical high, the first switch M1 236 switches off because its gate 242 is tied to, and driven by, node y. However, and as mentioned above, the feedback circuit branch 234 is already in open circuit due to the fact that the control stage switch M2 238 is off because the output 232 at node Z has been driven low.

Thus, this provides a significant improvement from the conventional circuit of FIG. 1, because the gate 244 of the control stage switch M2 238 is tied to node Z, as soon as the second output 232 at node Z goes to logical low, then, the control stage switch M2 238 is immediately switched off, thereby cutting off any leakage current that might otherwise flow from $V_{ddo}$ to ground through the first and third switches M1 236 and M3 240, as was the case with the conventional circuit of FIG. 1. As discussed above, in the absence of the control stage switch M2 238 and it being driven by the output Z, leakage current flow in the feedback circuit branch 234 is not cut out until the first output 216 at node y is driven high, thereby switching of the first switch M1 236. Consequently, the current rating and/or physical size of the third switch M3 240 can be significantly reduced in comparison with device $N_{fb}$ of FIG. 1. Therefore, the overall footprint of the digital voltage level shifter 200 may be significantly smaller than that of the conventional digital voltage level shifter of FIG. 1.

In the embodiment of FIG. 2, the concept implemented is that of using a single path from the higher-voltage supply Vddo to charge or discharge the intermediate nodes. This single path is cut off when the input assumes a low voltage domain high logic. The same circuit path and then re-made when the input voltage is at logical low, also reducing the fall delay, and assisted by an inverted input signal.

In the embodiment of FIG. 2, the control stage switch M2 238 assumes a non-conducting state when the output signal of the second output 232 is in a logical low state. The control stage switch M2 238 has a switch control input 244 connected to the second output 232 of the second inverter. As described above, in this embodiment, the control stage switch M2 238 is an NMOSFET having its gate at the switch control input 244, which is connected to the output of the second inverter at node Z so when the second output (node Z) goes low, the control stage switch M2 238 goes to the non-conducting or off state.

The first switch M1 236 also assists in helping to curtail leakage power in instances where the control stage switch M2 238 is a LVT device; that is, in this embodiment, the control stage switch M2 238 comprises a low voltage threshold (LVT) NMOSFET. Such devices have a higher sub-threshold leakage even when the voltage on the input (gate) of this transistor is sitting very close to, but not quite at, $V_{ddo}$. Thus, when the first switch M1 236 is in a non-conducting state, this helps prevent the possibility of breakdown of the control stage switch M2 238 when it is a LVT device. Additionally, the combination of voltages at the inputs of the switches M1 236, M2 238, and M3 240 that takes the voltage at node net131 220 quickly to ground.

As noted above, the embodiment of FIG. 2 may provide significant technical benefits when compared to, for example, the conventional circuit of FIG. 1. In this regard, circuit simulations were performed for the purposes of comparison between the conventional circuit FIG. 1 and the level shifter 200 of FIG. 2. The simulations were conducted with the 55 nm technology mode, in the voltage range of 0.9V to 1.32V, with the models of best, worst, typ, bpwn and wnwp. Rise delay, fall delay and leakage were measured, yielding the results shown in Tables 1-4.

TABLE 1

Transition times for low to high (0.9 V to 1.32 V)

| Circuit | Corner | Temp C. | Cell Rise (ns) | Cell Fall (ns) |
|---|---|---|---|---|
| FIG. 2 | wcs | −40 | 0.111 | 0.383 |
| FIG. 1 | wcs | −40 | 0.119 | 6.700 |
| FIG. 2 | typ | 25 | 0.093 | 0.264 |
| FIG. 1 | typ | 25 | 0.100 | 0.364 |

TABLE 2

Leakage current for low to high (1.32 V to 0.9 V)

| Circuit | Corner | Temp C. | Leakage (W) |
|---|---|---|---|
| FIG. 2 | wcs | 150 | 8.59E−08 |
| FIG. 1 | wcs | 150 | 1.36E−07 |

TABLE 3

Input transition for high to low (1.32 V to 0.9 V)

| Circuit | Corner | Temp C. | Cell Rise (ns) | Cell Fall (ns) |
|---|---|---|---|---|
| FIG. 2 | wcs | −40 | 0.113 | 0.106 |
| FIG. 1 | wcs | −40 | 0.115 | 0.509 |
| FIG. 2 | typ | 25 | 0.093 | 0.091 |
| FIG. 1 | typ | 25 | 0.095 | 0.362 |

TABLE 4

Leakage current for high to low (1.32 V to 0.9 V)

| Circuit | Corner | Temp C. | Leakage (W) |
|---|---|---|---|
| FIG. 2 | wcs | 150 | 4.05E−08 |
| FIG. 1 | wcs | 150 | 5.92E−08 |

In tables 1-4, bcs refers to the best condition on which the chip is working i.e. chip is experiencing the most favorable conditions or more specifically when PMOS and NMOS are performing best means fastest (MOS behavior under these conditions). wcs refers to the worst condition on which the chip is working i.e. chip is experiencing the most unfavorable conditions or more specifically when PMOS and NMOS are performing worst means slowest. Typ refers to the typical condition on which the chip is working i.e. chip is experiencing the normal conditions or more specifically when PMOS and NMOS are performing typically means expected. bpwn refers to the best PMOS and worst NMOS condition on which the chip is working i.e. chip is experiencing the corner conditions or more specifically when PMOS are operating under the best conditions and NMOS are working under worst conditions. bnwp refers to the best NMOS and worst PMOS condition on which the chip is working i.e. chip is experiencing the corner conditions or more specifically when NMOS are working under best conditions and PMOS are working under worst conditions.

Table 1 illustrates the advantage of the level shifter 200 when compared with the level shifter of FIG. 1 in the cell fall time, when the input signal is at 0.9V and being shifted to 1.32V at the output. Table 2 illustrates that the level shifter 200 has lower leakage power than the circuit of FIG. 1, when the input signal is at 0.9V and being shifted to 1.32V at the output. Table 3 illustrates that the level shifter 200 has faster cell fall time than the circuit of FIG. 1 when the input signal is at 1.32V and shifting it to 0.9V at the output. Table 4 illustrates that the level shifter 200 has improved leakage power consumption over the circuit of FIG. 1 when the input signal is at 1.32V and being shifted to 0.9V at the output.

Therefore, it can be seen that significant improvements are realized in the cell fall times. For instance, the simulation cell fall time when transitioning from logical low to logical high for the circuit of FIG. 1 on the wcs process corner is 6.7 ns, compared with 0.383 ns as simulated for the circuit of FIG. 2. Further, the simulated leakage power loss is reduced from 1.36E−07 W in the circuit of FIG. 1 to 8.59E−08 W of FIG. 2. In low to high voltage shifting, the circuit of FIG. 2 can translate signals in the range of 0.75 V to 1.32 V under the bcs, typ, wcs, wnbp, and bnwp process corners. Further, signal translation by the level shifter 200 is bidirectional. The embodiment may be implemented in applications where shifting from a lower to a higher voltage is required, and also when shifting from a higher to a lower voltage.

Table 5 illustrates the FMEA (Failure Mode Analysis) results for the level shifter 200.

TABLE 5

FMEA RESULTS

| Corner | Temp | Voltage V | Functional result | Cell Rise (ns) | Cell Fall (ns) |
|---|---|---|---|---|---|
| wcs | −40 | Vddi = 0.75, Vddo = 1.32 | FAIL | 0.173 | 1.06 |
| wcs | 25 | Vddi = 0.75, | PASS | 0.173 | 0.853 |

TABLE 5-continued

FMEA RESULTS

| Corner | Temp | Voltage V | Functional result | Cell Rise (ns) | Cell Fall (ns) |
|---|---|---|---|---|---|
| wcs | 150 | Vddi = 0.75, Vddo = 1.32 | PASS | 0.168 | 0.670 |
| wcs | −40 | Vddi = 0.76, Vddo = 1.32 | PASS | 0.162 | 0.986 |
| wcs | 25 | Vddi = 0.76, Vddo = 1.32 | PASS | 0.166 | 0.792 |
| wcs | 150 | Vddi = 0.76, Vddo = 1.32 | PASS | 0.163 | 0.637 |

The results in the above tables demonstrate a significant reduction in the fall delay, approximately 20 times less when compared with the circuit of FIG. 1. Further, leakage is less when compared to the prior art, an improvement of between 50 and 100%, as may be derived from Tables 1 to 4.

Furthermore, this allows a significant area reduction in the footprint of the digital voltage level shifter in comparison to the prior art. Yet further, the circuit of FIG. 2 is able to operate with an input voltage of down to 0.75 V.

By now it should be appreciated that there has been provided novel techniques for digital voltage level shifting which may be implemented across, for example, all low-power System on Chip (SoC) designs using multiple voltage domains, where it is required to pass signals from one voltage domain to another. This may be realized by having a switching device in a feedback circuit branch assume a non-conducting state when the output of the digital voltage level shifter falls to logical low.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A level shifter that converts an input signal at a first voltage level to an output signal at a second voltage level different from the first voltage level, the level shifter comprising:
    a voltage translation stage connected between a higher voltage source and ground, and including a first inverter that receives the input signal at the first voltage level and generates an intermediate signal at the second voltage level;
    a driver stage connected between the higher voltage source and ground, and including a second inverter connected to the first inverter and receiving the intermediate signal and generating the output signal at the second voltage level; and
    a control stage connected to the voltage translation stage and the driver stage, the control stage including,
        a feedback circuit branch connected between the higher voltage source and ground, and
        a control stage inverter connected between a lower voltage source and ground, wherein the control stage inverter receives the input signal and generates a control stage inverter output that is provided as an input to the second inverter and to the feedback circuit branch, and wherein the feedback circuit branch also receives the intermediate signal and the output signal and generates a feedback branch output signal that is input to the voltage translation stage.

2. The level shifter of claim 1, wherein the first inverter comprises a first PMOS transistor and a first NMOS transistor connected in series between the higher voltage supply and ground, wherein the first PMOS and first NMOS transistors receive the input signal at their gates and the intermediate signal is provided at a node between the drains of the first PMOS and NMOS transistors, which are connected together.

3. The level shifter of claim 2, wherein the voltage translation stage includes an additional transistor connected between the higher voltage source and the source of the first PMOS transistor and having a gate that receives the feedback branch output signal.

4. The level shifter of claim 3, wherein the second inverter of the driver stage comprises:
    a second PMOS transistor having a source connected to the higher power supply, and a gate connected to the node between the drains of the first PMOS and NMOS transistors and receiving the intermediate signal; and
    a second NMOS transistor having a drain connected to the drain of the second PMOS transistor, a source connected to ground, and a gate connected to the output of the control stage inverter, wherein the output signal is provided at a node between the drains of the second PMOS and NMOS transistors.

5. The level shifter of claim 4, wherein the feedback circuit branch comprises:
    a first switch having a source connected to the higher power supply, and a gate that receives the intermediate signal generated by the first inverter;
    a second switch having a drain connected to a drain of the first switch, and a gate that receives the output signal from the second inverter; and
    a third switch having a drain connected to a source of the second switch, a source connected to ground, and a gate connected to the output of the control stage inverter and receiving the control stage inverter output.

6. The level shifter of claim 5, wherein the first switch is a PMOS device, and the second and third switches are NMOS devices.

7. The level shifter of claim 5, the control stage inverter comprises:
    a PMOS transistor having a source connected to the lower voltage supply, and a gate that receives the input signal; and
    a NMOS transistor having a drain connected to a drain of the control stage inverter PMOS transistor drain, a source connected to ground, and a gate connected to the gate of the gate of the control stage inverter PMOS transistor and receiving the input signal.

8. The level shifter of claim 7, wherein the control stage switch comprises a low-voltage threshold device.

* * * * *